United States Patent
Yu et al.

(10) Patent No.: US 8,051,364 B2
(45) Date of Patent: Nov. 1, 2011

(54) REED SOLOMON DECODER AND IBMA METHOD AND PARALLEL-TO-SERIAL CONVERSION METHOD THEREOF

(75) Inventors: Yu Ping Yu, Hsinchu County (TW); Jenn Kaie Lain, Tainan (TW); Ching Lung Chang, Yunlin County (TW); Chih Hung Hsu, Taichung County (TW)

(73) Assignee: Industrial Technology Research Institute, Hsinshu County (TW)

( * ) Notice: Subject to any disclaimer, the term of this patent is extended or adjusted under 35 U.S.C. 154(b) by 1172 days.

(21) Appl. No.: 11/762,447

(22) Filed: Jun. 13, 2007

(65) Prior Publication Data

US 2008/0244363 A1 Oct. 2, 2008

(30) Foreign Application Priority Data

Mar. 28, 2007 (TW) ................................ 96110686 A

(51) Int. Cl.
*H03M 13/00* (2006.01)
(52) U.S. Cl. .......................................... 714/784; 714/785
(58) Field of Classification Search .................. 714/784, 714/785
See application file for complete search history.

(56) References Cited

U.S. PATENT DOCUMENTS

| | | | |
|---|---|---|---|
| 5,483,236 A * | 1/1996 | Bi | 341/94 |
| 6,209,115 B1 * | 3/2001 | Truong et al. | 714/784 |
| 6,286,123 B1 | 9/2001 | Kim | |
| 6,317,858 B1 | 11/2001 | Cameron | |
| 6,539,516 B2 | 3/2003 | Cameron | |
| 7,010,739 B1 * | 3/2006 | Feng et al. | 714/784 |
| 7,051,267 B1 * | 5/2006 | Yu et al. | 714/784 |
| 7,080,310 B2 * | 7/2006 | Cameron | 714/785 |
| 7,249,310 B1 * | 7/2007 | Feng et al. | 714/784 |
| 7,322,004 B1 * | 1/2008 | Yu et al. | 714/784 |
| 7,716,562 B1 * | 5/2010 | Wu et al. | 714/784 |

OTHER PUBLICATIONS

Hsie-Chai Chang et al., A Reed-Solomon Procduct-Code (RS-PC) Decoder Chip for DVD Application, Journal, Feb. 2001, pp. 229-238, vol. 36 No. 2, IEEE Journal of Solid-State Circuits.

* cited by examiner

*Primary Examiner* — Esaw Abraham
(74) *Attorney, Agent, or Firm* — WPAT, P.C.; Anthony King

(57) ABSTRACT

A parallel-to-serial conversion method for IBMA in a Reed Solomon decoder is used for obtaining discrepancies in IBMA iterations, thereby acquiring an error location polynomial and an error value polynomial. Syndrome sequences for the calculation of discrepancies in IBMA iterations have a fixed length. The number of syndromes is t+1, where t is the largest number of symbols that can be corrected of the error location polynomial. The feature that syndrome sequences have the same length is based on the fact that the discrepancies are not affected if the coefficients of polynomial orders of the error location polynomial are zero.

16 Claims, 9 Drawing Sheets

REED SOLOMON DECODER AND IBMA METHOD AND PARALLEL-TO-SERIAL CONVERSION METHOD THEREOF

BACKGROUND OF THE INVENTION (A) Field of the Invention

The present invention is related to a Reed Solomon decoder and Inversionless Berlekamp-Massey Algorithm (IBMA) and parallel-to-serial conversion method thereof.

(B) Description of the Related Art

Error correction codes (ECC) are in wide use, with respect to current general applications. For example, consumer electronics using high speed digital communications, optic disc storage and high resolution television all use Reed Solomon decoders.

Nowadays, there are many transmission technologies and equipment that are widely used, and transmission rates have increased from 56 Kbps to several gigabytes per second. However, noise interference may occur during signal transmission, resulting in data receiving errors. Therefore, receiving equipment should be simple, popular and have high efficiency error correction capability to correct transmission errors due to channel noises.

U.S. Pat. No. 6,286,123 B1 disclosed a Berlekamp-Massey Algorithm (BMA) in which a parallel-to-serial interface directly uses multiplexers as interfaces. However, control signals are more complicated and divisional operation devices are needed in BMA architecture.

In U.S. Pat. Nos. 6,317,858 B1 and 6,539,516 B2, although the parallel-to-serial interface of IBMA architecture is changed to be of serial entering, it has less regularity and the error value polynomial is calculated after the error location polynomial is obtained.

A parallel-to-serial interface and an IBMA architecture are compared as follows. FIG. 1 illustrates a traditional Reed Solomon decoder 10 including a syndrome calculator 11, a parallel-to-serial (PS) interface 12, an IBMA apparatus 13, a key equation solver 14, a serial-to-parallel (SP) interface 15, a Chien search device 16 (error location) and a Chien search device 17 (error value), a first-in-first-out (FIFO) circuit 18 and a Forney algorithm device 19. The syndrome calculator 11 receives messages r(x) from a receiving end and calculates syndromes. The syndromes are transmitted to the IBMA apparatus 13 through the parallel-to-serial interface 12. The IBMA apparatus 13 generates an error location polynomial $\Lambda(x)$ based on the syndromes. The key equation solver 14 generates an error value polynomial $\Omega(x)$ based on the syndromes and $\Lambda(x)$. $\Lambda(x)$ and $\Omega(x)$ are transmitted to the Chien search devices 16 and 17 through the serial-to-parallel interface 15 to solve error locations and the Forney algorithm device 19 calculates error values. r(x) is registered in the FIFO circuit 18 and corrected by the error values obtained by the Forney algorithm device 19, so as to obtain messages c(x) at the end of the transmission.

Accordingly, there are problems with the error value polynomial $\Omega(x)$ being obtained after the error location polynomial $\Lambda(x)$ is obtained, and the parallel-to-serial interface has less regularity.

FIG. 2 illustrates a traditional parallel-to-serial interface using multiplexers. The parallel-to-serial interface includes 16 syndrome cells 22 and a multiplexer 21. The corresponding syndrome sequences are shown in Table 1.

TABLE 1

| $\Lambda^{(i)}$ | Syndrome sequences |
|---|---|
| i = 0 | $S_1$ |
| i = 1 | $S_2, S_1$ |
| i = 2 | $S_3, S_2, S_1$ |
| i = 3 | $S_4, S_3, S_2, S_1$ |
| i = 4 | $S_5, S_4, S_3, S_2, S_1$ |
| i = 5 | $S_6, S_5, S_4, S_3, S_2, S_1$ |
| i = 6 | $S_7, S_6, S_5, S_4, S_3, S_2, S_1$ |
| i = 7 | $S_8, S_7, S_6, S_5, S_4, S_3, S_2, S_1$ |
| i = 8 | $S_9, S_8, S_7, S_6, S_5, S_4, S_3, S_2, S_1$ |
| i = 9 | $S_{10}, S_9, S_8, S_7, S_6, S_5, S_4, S_3, S_2$ |
| i = 10 | $S_{11}, S_{10}, S_9, S_8, S_7, S_6, S_5, S_4, S_3$ |
| i = 11 | $S_{12}, S_{11}, S_{10}, S_9, S_8, S_7, S_6, S_5, S_4$ |
| i = 12 | $S_{13}, S_{12}, S_{11}, S_{10}, S_9, S_8, S_7, S_6, S_5$ |
| i = 13 | $S_{14}, S_{13}, S_{12}, S_{11}, S_{10}, S_9, S_8, S_7, S_6$ |
| i = 14 | $S_{15}, S_{14}, S_{13}, S_{12}, S_{11}, S_{10}, S_9, S_8, S_7$ |
| i = 15 | $S_{16}, S_{15}, S_{14}, S_{13}, S_{12}, S_{11}, S_{10}, S_9, S_8$ |

The IBMA algorithm is a modification from BMA algorithm, with a view to decreasing hardware complexity, in which divisional operation in BMA is replaced with a non-divisional operation and a multiple of the original polynomial is obtained. According to features of Galois Field, the same root can be solved. This algorithm is used for obtaining the error location polynomial $\Lambda(x)$. The IBMA architecture and calculation are exemplified as follows.

Initial conditions:

$$D^{(-1)} = 0 \quad \delta = 1$$
$$\Lambda^{(-1)}(x) = 1 \quad T^{(-1)}(x) = 1$$
$$\Lambda^{(0)} = S_1$$
For i=0 to 2t−1
{
$$\Delta^{(i+1)} = S_{i+2} * \Lambda_0^{(i)} + S_{i+1} * \Lambda_1^{(i)} + \ldots + S_{i-vi+2} * \Lambda_{vi}^{(i)}$$
If $\Delta^{(i)} = 0$ or $2D^{(i-1)} \geq i+1$
$$D^{(i)} = D^{(i+1)}$$
$$T^{(i)}(x) = x * T^{(i-1)}(x)$$
$$\delta = \delta$$
$$\Lambda^{(i)}(x) = \Lambda^{(i-1)}(x)$$
Else
$$D^{(i)} = i+1-D^{(i-1)}$$
$$T^{(i)}(x) = \Lambda^{(i-1)}(x)$$
$$\delta = \Delta^{(i)}$$
$$\Lambda^{(i)}(x) = \delta * \Lambda^{(i-1)}(x) + \delta^{(i)} * x * T^{(i-1)}(x)$$
}

$\Omega(x) \bmod x^{2t} = S(x) * \Lambda^{(2t)}(x)$ where $\Lambda^{(i)}(x)$ is the error location polynomial at ith iteration $\Lambda_j^{(i)}(x)$ is coefficients of orders of $\Lambda^{(i)}(x)$ j is x order $\Delta^{(i)}$ is discrepancy of ith iteration $\delta$ is discrepancy of $T^{(i)}(x)$ with corrected iteration $T^{(i)}(x)$ is an auxiliary polynomial $D^{(i)}$ is the highest order of the auxiliary polynomial S(x) is syndrome array $S_1 \sim S_{2t}$ $\Omega(x)$ is a key equation FIG. 3 illustrates a traditional IBMA apparatus 30, and FIG. 4 illustrates the architecture for calculation of a key equation based on the architecture shown in FIG. 3. The IBMA apparatus 30 comprises multipliers 31, 40 and 41, buffers 32 and 37, adders 33 and 39, multiplexers 35 and 43 and registers 34, 36, 38, 42 and 44.

In order to obtain higher regularity and lower hardware complexity, the separated IBMA algorithm can implement serial input data sequences as shown in Table 1. The error location polynomial and the key equation (error value polynomial) after separation are listed in Table 2.

TABLE 2

| Error location polynomial | Key equation |
|---|---|
| $\Lambda^{(i)}(x) = \Lambda_0^{(i)} + \Lambda_1^{(i)}x + \ldots + \Lambda_{vi}^{(i)}x^{vi}$ | $\Omega(x) = S(x)\Lambda(x) \bmod x^{2t}$ |
| | $\cong \Omega^{(0)} + \Omega^{(1)}x + \ldots \Omega^{(v-1)}x^{v-1}$ |
| $\Lambda_j^{(i)} = \begin{cases} \delta * \Lambda_0^{(i-1)}, & j = 0 \\ \delta * \Lambda_j^{(i-1)} + \Delta^{(i)}T_{j-1}^{(i-1)}, & 1 \le j \le vi \end{cases}$ | $\Omega^{(i)} = S_{i+1}\Lambda_0 + S_i\Lambda_1 + \ldots + S_1\Lambda_i$ |
| $\Delta^{(i+1)} = \sum_{j=0}^{vi} \Delta_j^{(i+1)}$ | $\Omega_j^{(i)} = \begin{cases} S_{i+1}\Lambda_0 & \text{for } i = 0 \\ \Omega_{j-1}^{(i)} + S_{i-j+1}\Lambda_j & \text{for } 1 \le j \le i \end{cases}$ |
| $\Delta_j^{(i+1)} = \begin{cases} 0, & j = 0 \\ \Delta_{j-1}^{(i+1)} + S_{i-j+3} * \Lambda_{j-1}^{(i)}, & 1 \le j \le vi \end{cases}$ | |

As shown in Table 2, the error value polynomial $\Omega(x)$ is derived based on the error location polynomial $\Lambda(x)$. In other words, $\Lambda(x)$ is obtained first so as to obtain $\Omega(x)$. Moreover, as mentioned above, the parallel-to-serial interface has less regularity, so there still remains room for improvement.

SUMMARY OF THE INVENTION

Traditional parallel-to-serial interfaces are limited to the use of multiplexers. Therefore, an IBMA method and the related parallel-to-serial conversion method applied in the Reed Solomon decoder are disclosed in this invention, so as to increase throughput of the Reed Solomon decoder and decrease design and production costs.

A parallel-to-serial conversion method for IBMA in the Reed Solomon decoder is used for obtaining discrepancies in IBMA iterations, thereby acquiring an error location polynomial and an error value polynomial. Syndrome sequences for the calculation of discrepancies in IBMA iterations have fixed lengths, i.e., same lengths or the same number of syndromes. The number of syndromes is t+1, where t is the largest number of symbols that can be corrected of the error location polynomial. The feature that the syndrome sequences have the same lengths is based on the fact that the discrepancies are not affected if the coefficients of orders of the error location polynomial are zero.

The IBMA algorithm of the Reed Solomon decoder in accordance with the present invention is to derive discrepancies in IBMA iterations based on syndrome sequences, and the error location polynomial and error value polynomial are simultaneously obtained based on the discrepancies.

The Reed Solomon decoder of the present invention comprises a parallel-to-serial interface and an IBMA apparatus. The IBMA apparatus is coupled to an output end of the parallel-to-serial interface and comprises an error location polynomial solver configured to calculate an error location polynomial and an error value polynomial solver connected to an output end of discrepancies of the error location polynomial solver, so as to obtain an error value polynomial based on the discrepancies. The error location polynomial and the error value polynomial are obtained simultaneously.

DETAILED DESCRIPTION OF THE INVENTION

The present invention will be explained with the appended drawings to clearly disclose the technical characteristics of the present invention.

Figure 5:
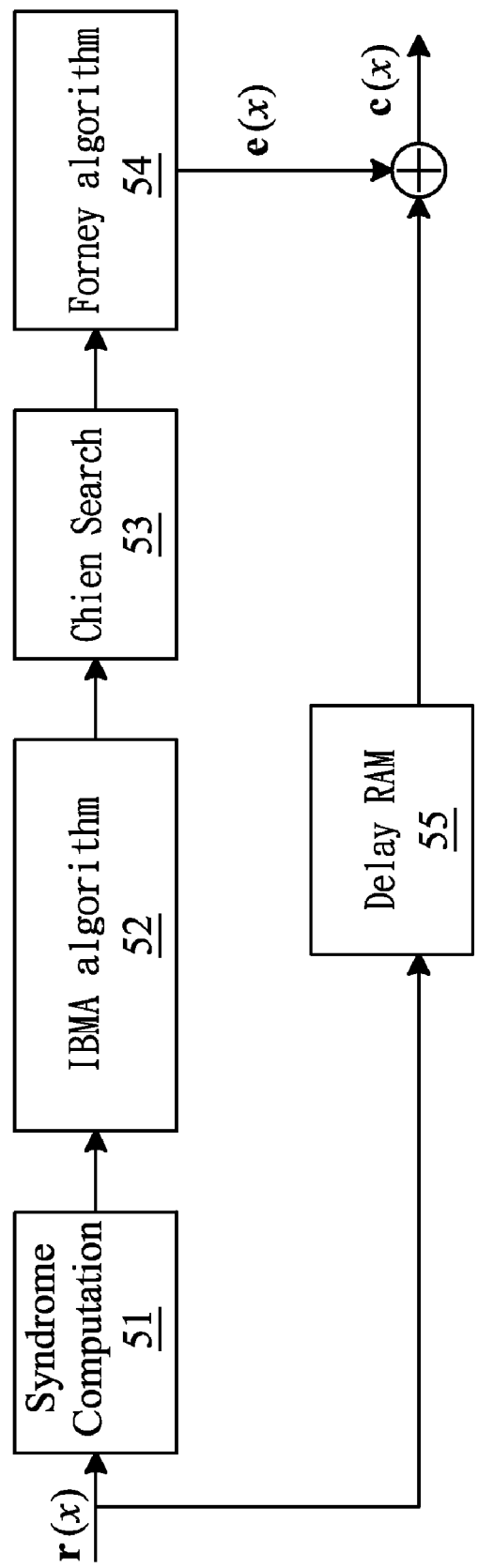
FIG. 5 illustrates an operation block diagram of the Reed Solomon decoder of the present invention.

FIG. 5 is a function block diagram of a Reed Solomon decoder in accordance with the present invention, including syndrome computation 51, IBMA algorithm 52, Chien search 53 and Forney algorithm 54. Syndrome computation 51 finds syndromes including information of error location and error value for separation of error location information and error value information in the IBMA algorithm 52. The separated data are resolved through the Chien search 53 and the Forney algorithm 54 for correction of a message r(x) stored in a delay RAM 55. r(x) is the received message, e(x) is channel noise, and c(x) is the transmission message.

Figure 6:
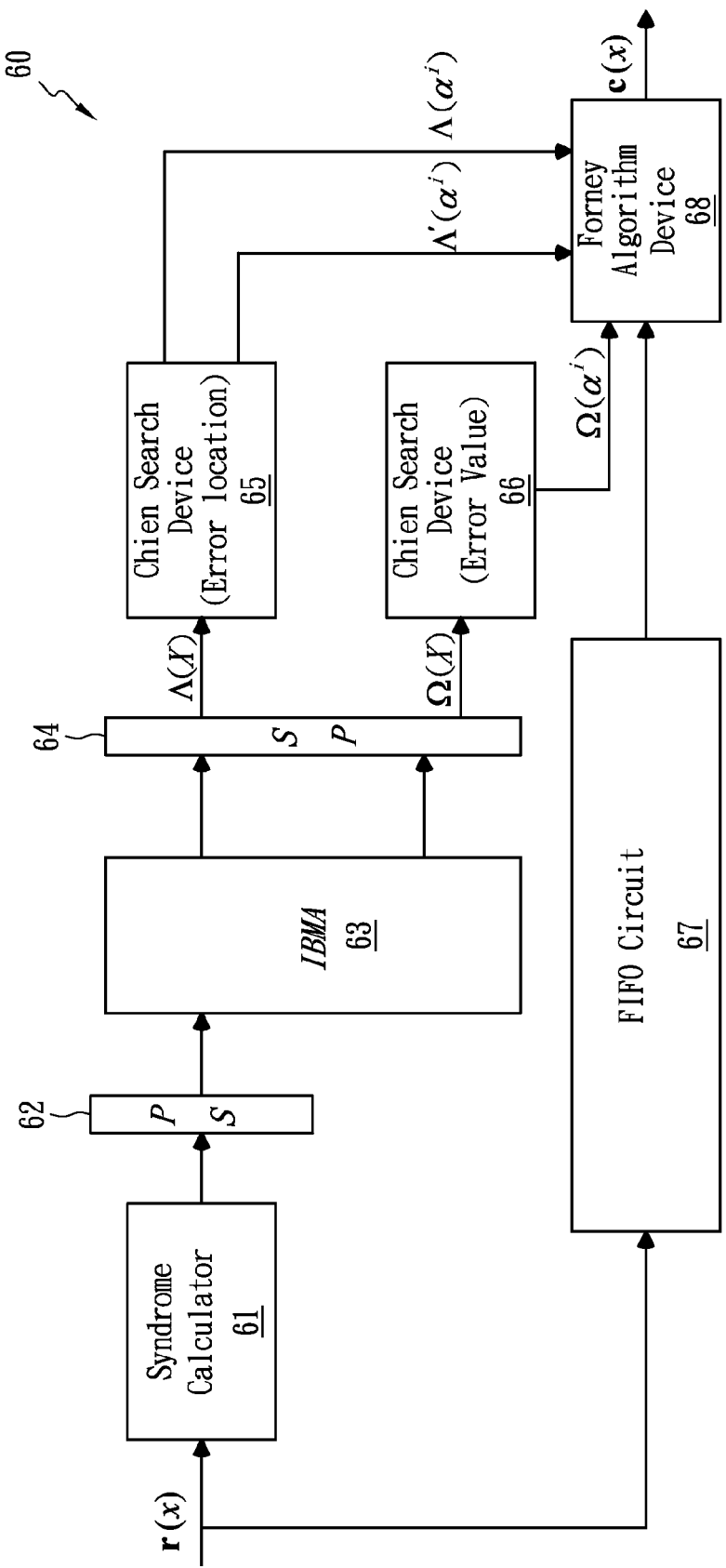
FIG. 6 illustrates a block diagram of the Reed Solomon decoder of the present invention.

FIG. 6 illustrates a Reed Solomon decoder in accordance with the present invention, which is modified in response to problems of prior art, so as to obtain error location polynomial and error value polynomial simultaneously, and provides a parallel-to-serial interface with high regularity for better performance. A Reed Solomon decoder 60 includes a syndrome calculator 61, a parallel-to-serial (PS) interface 62, an IBMA apparatus 63, a serial-to-parallel (SP) interface 64, a Chien search device (error location) 65, a Chien search device (error value) 66, a first-in-first-out (FIFO) circuit 67 and a Forney algorithm device 68.

Figure 1:
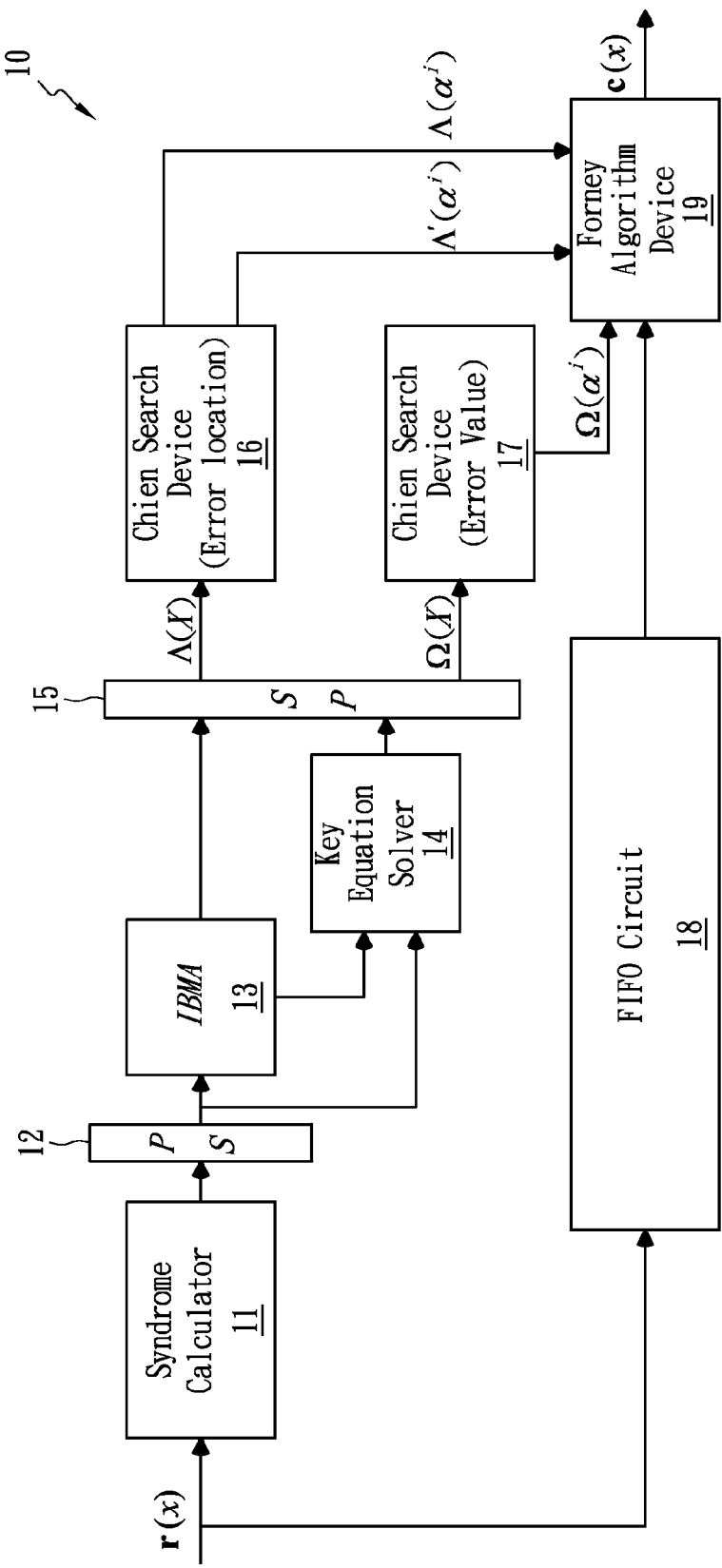
FIG. 1 illustrates a known Reed Solomon decoder.
Figure 2:
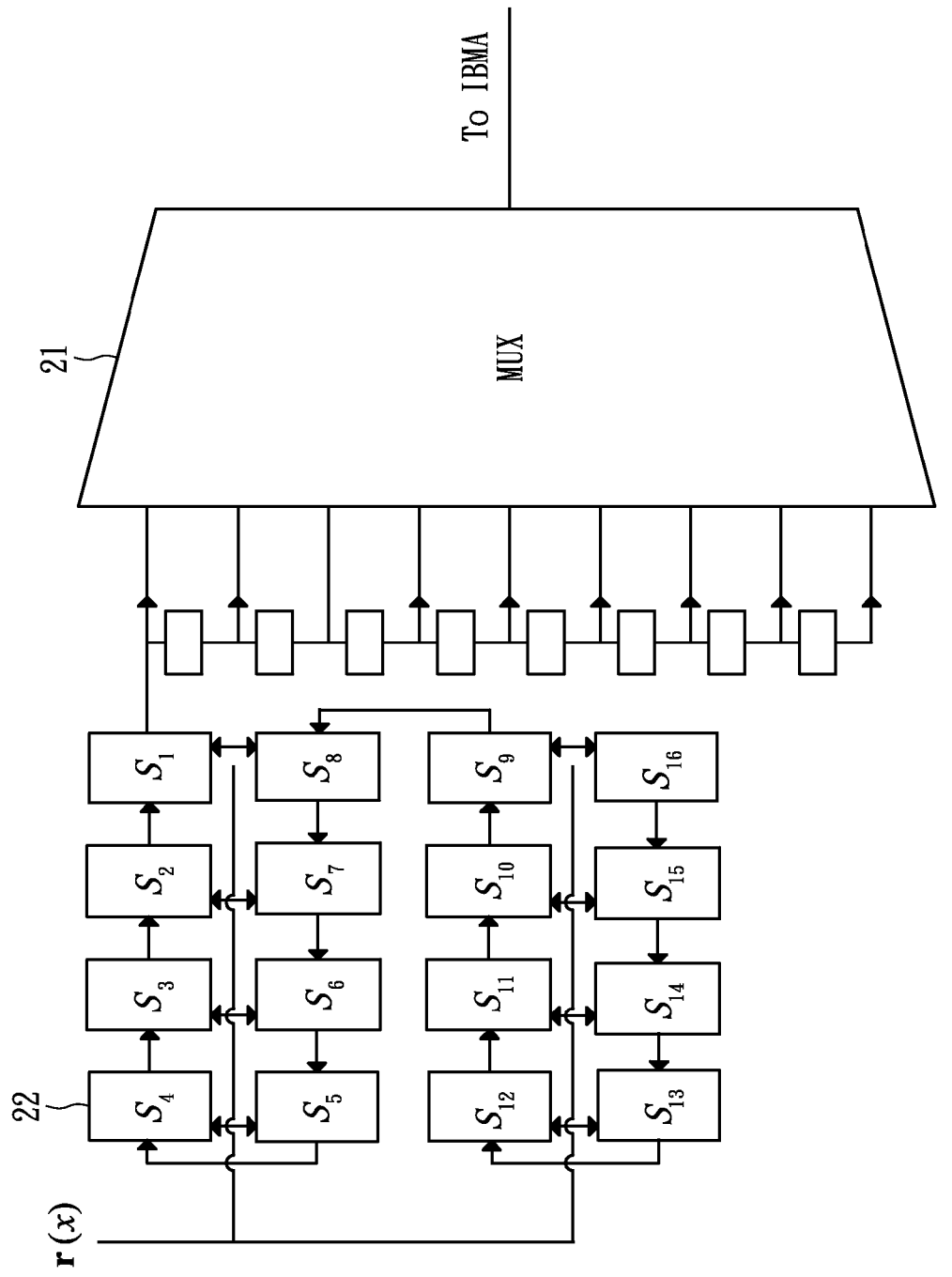
FIG. 2 illustrates a known parallel-to-serial interface corresponding to the IBMA architecture of Reed Solomon decoder.
Figure 3:
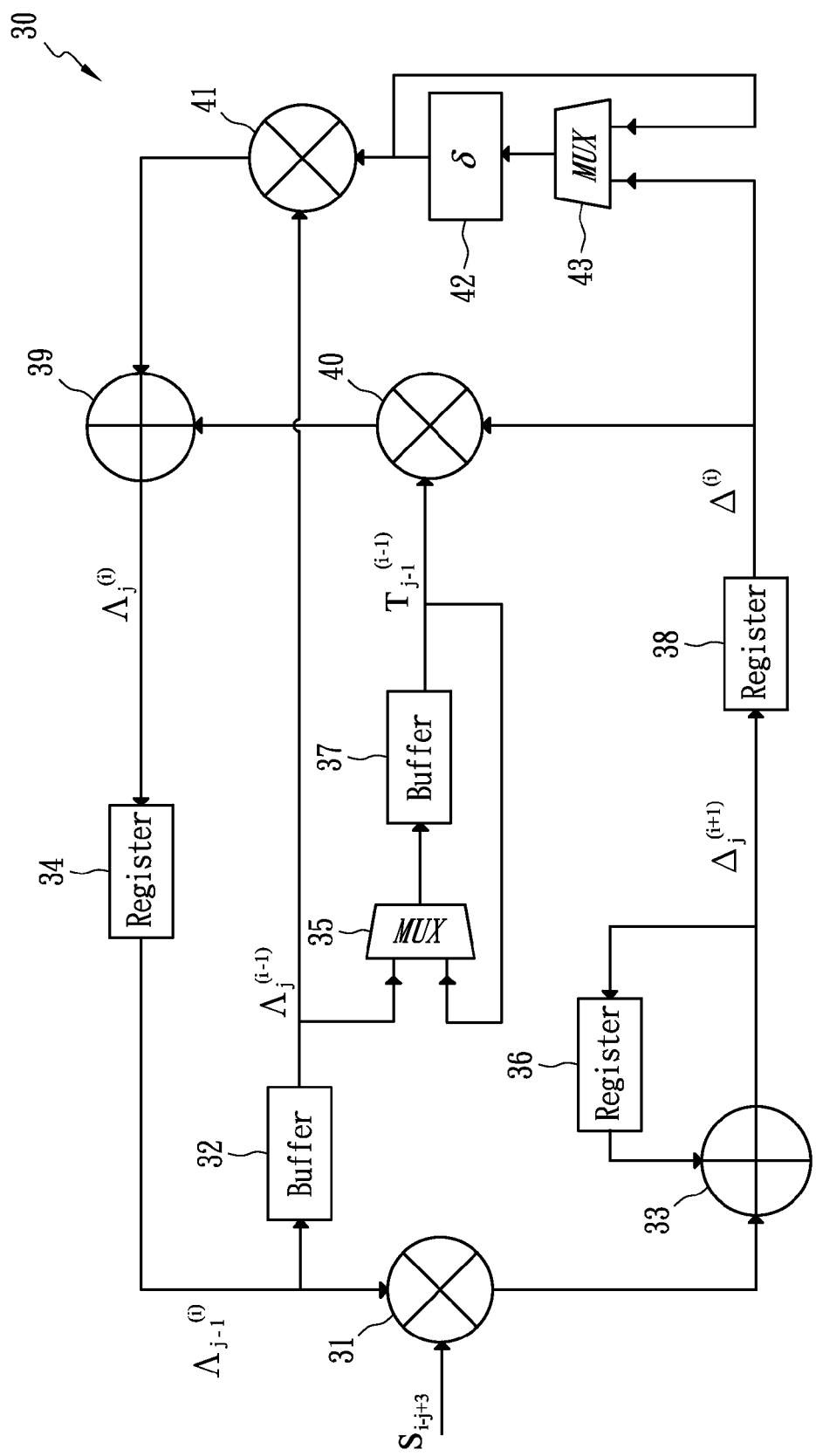
FIG. 3 illustrates a known IBMA architecture of the Reed Solomon decoder.
Figure 4:
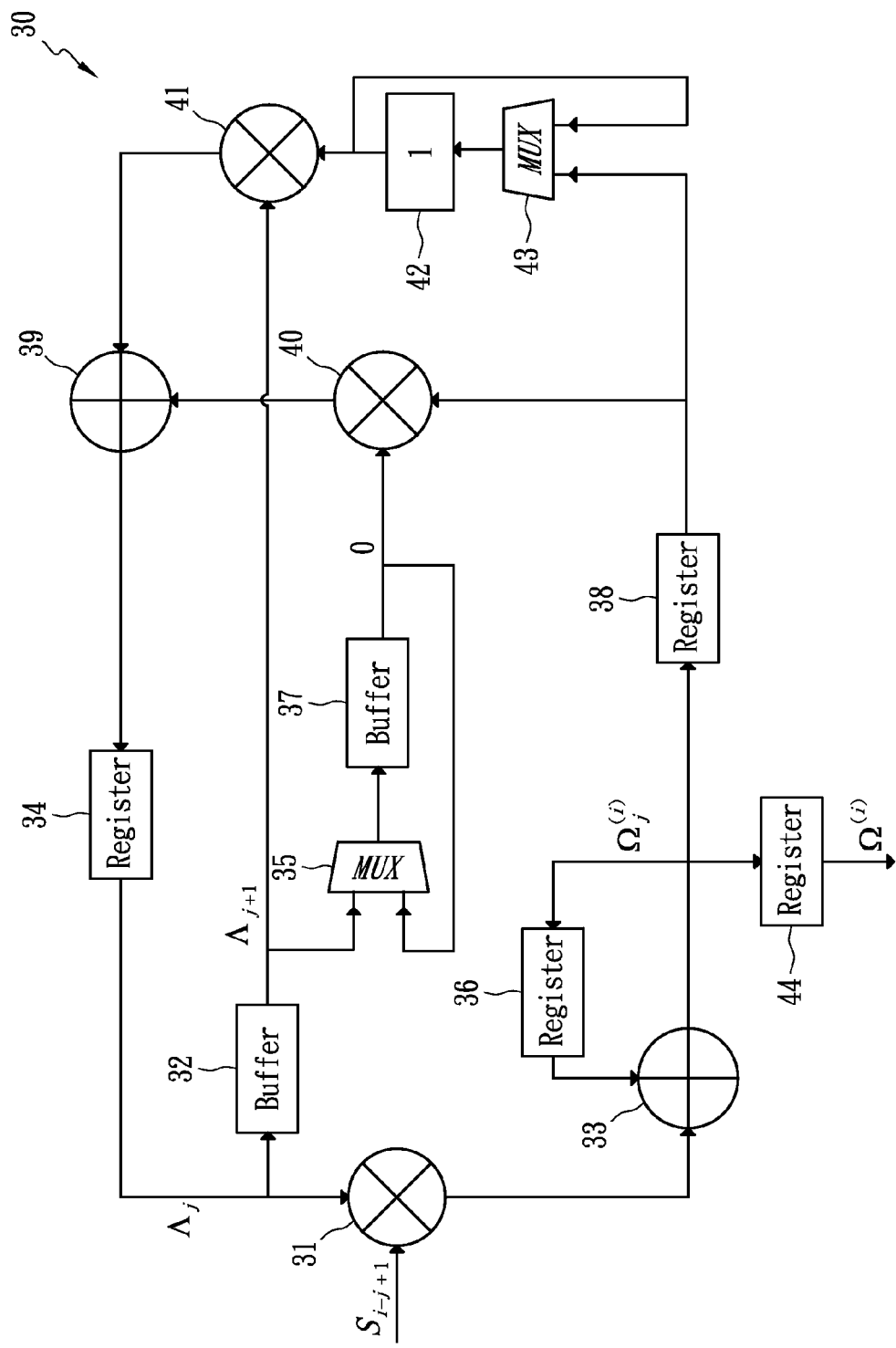
FIG. 4 illustrates architecture for the calculation of the key equation based on architecture of FIG. 3.

In comparison with the traditional Reed Solomon decoder 10 of FIG. 1, the Reed Solomon decoder 60 only needs an IBMA apparatus 63 to simultaneously acquire the error location polynomial and the error value polynomial. Moreover, the calculation of the parallel-to-serial interface 62 is also improved to decrease hardware complexity.

Figure 7:
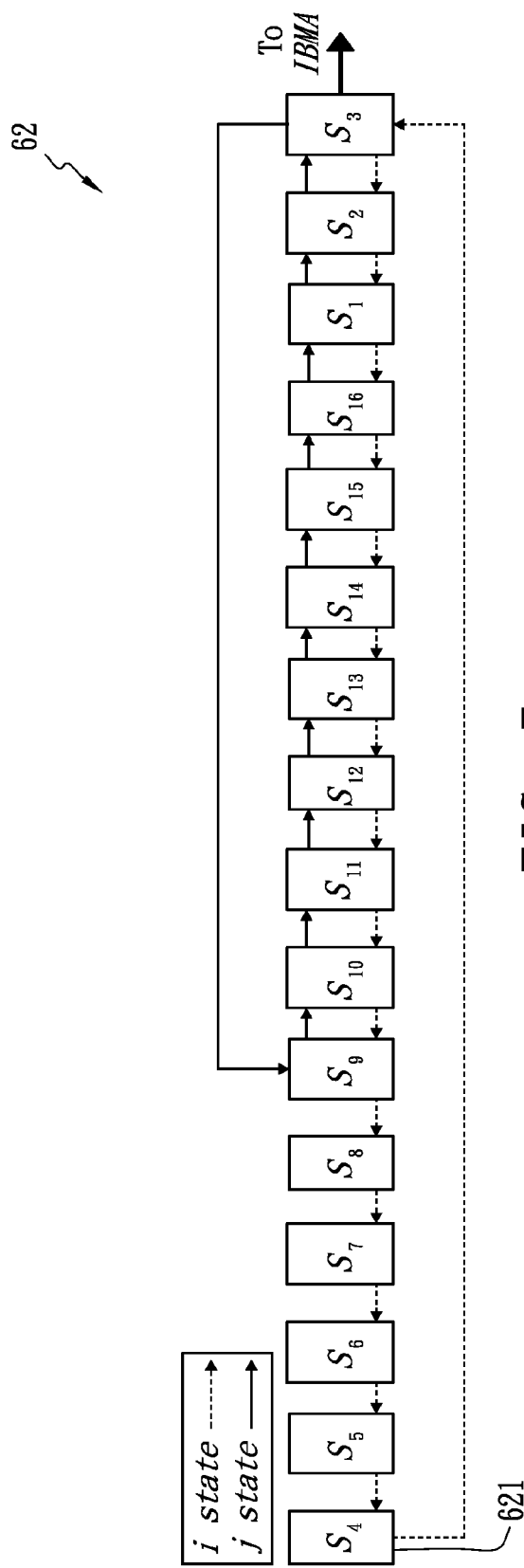
FIG. 7 illustrates a parallel-to-serial interface of the Reed Solomon decoder using IBMA architecture in accordance with the present invention.

In an embodiment of the parallel-to-serial interface 62 shown in FIG. 7, a parallel-to-serial conversion method of Inversionless Berlekamp-Massey Algorithm (IBMA) of a Reed Solomon decoder for obtaining discrepancies of IBMA iterations to derive an error location polynomial and an error value polynomial is provided. The method is used in a Reed Solomon decoder and comprising a step of setting syndrome sequences to be of same lengths when calculating the discrepancy in each IBMA iteration, wherein the number of syndromes of the syndrome sequences is t+1, and t is the largest number of symbols that corrected of the error location polynomial, wherein the syndrome sequences set to be of same lengths are based on the feature that the discrepancies are not affected if coefficients of orders of the error location polynomial are zero. The parallel-to-serial interface 62 comprises 16 serially connected syndrome cells 621. Multiplexers are not needed in the parallel-to-serial interface 62. The syndrome sequences are listed in Table 3, in which if X order of the polynomial is equal to zero, the corresponding syndrome values are not changed during iteration. Accordingly, the syndrome sequences are set to be of fixed length so as to acquire a parallel-to-serial interface with high regularity. The syndrome sequence comprises syndromes of the orders of the error location polynomial not equal to zero. Syndromes of orders of the error location polynomial are equal to zero in reverse order. In each iteration, the syndromes of the syndrome sequence in a previous iteration are shifted right. The rightmost syndrome is removed. A syndrome next to the leftmost syndrome in the previous iteration is added to the left of the syndrome sequence. The syndrome sequence is selected from a sequence including syndromes. In each iteration, the rightmost syndrome is moved to the far left side. The syndrome sequence includes the leftmost t+1 syndromes.

TABLE 3

| $\Delta^{(i)}$ | Syndrome Sequences |
|---|---|
| i = 0 | $S_1, S_{16}, S_{15}, S_{14}, S_{13}, S_{12}, S_{11}, S_{10}, S_9$ |
| i = 1 | $S_2, S_1, S_{16}, S_{15}, S_{14}, S_{13}, S_{12}, S_{11}, S_{10}$ |
| i = 2 | $S_3, S_2, S_1, S_{16}, S_{15}, S_{14}, S_{13}, S_{12}, S_{11}$ |
| i = 3 | $S_4, S_3, S_2, S_1, S_{16}, S_{15}, S_{14}, S_{13}, S_{12}$ |
| i = 4 | $S_5, S_4, S_3, S_2, S_1, S_{16}, S_{15}, S_{14}, S_{13}$ |
| i = 5 | $S_6, S_5, S_4, S_3, S_2, S_1, S_{16}, S_{15}, S_{14}$ |
| i = 6 | $S_7, S_6, S_5, S_4, S_3, S_2, S_1, S_{16}, S_{15}$ |
| i = 7 | $S_8, S_7, S_6, S_5, S_4, S_3, S_2, S_1, S_{16}$ |
| i = 8 | $S_9, S_8, S_7, S_6, S_5, S_4, S_3, S_2, S_1$ |
| i = 9 | $S_{10}, S_9, S_8, S_7, S_6, S_5, S_4, S_3, S_2$ |
| i = 10 | $S_{11}, S_{10}, S_9, S_8, S_7, S_6, S_5, S_4, S_3$ |
| i = 11 | $S_{12}, S_{11}, S_{10}, S_9, S_8, S_7, S_6, S_5, S_4$ |
| i = 12 | $S_{13}, S_{12}, S_{11}, S_{10}, S_9, S_8, S_7, S_6, S_5$ |
| i = 13 | $S_{14}, S_{13}, S_{12}, S_{11}, S_{10}, S_9, S_8, S_7, S_6$ |
| i = 14 | $S_{15}, S_{14}, S_{13}, S_{12}, S_{11}, S_{10}, S_9, S_8, S_7$ |
| i = 15 | $S_{16}, S_{15}, S_{14}, S_{13}, S_{12}, S_{11}, S_{10}, S_9, S_8$ |

The syndrome sequence includes syndromes of orders of the polynomial not equal to zero and syndromes of orders of the polynomial equal to zero in reverse order. In each iteration, the syndromes in the previous iteration are shifted right, the rightmost syndrome is removed, and a syndrome next to the leftmost syndrome in the previous iteration is added to the left of the syndrome sequence. Syndrome sequences shown in Table 3 are selected from a sequence of $S_1, S_{16}, S_{15}, S_{14}, S_{13}, S_{12}, S_{11}, S_{10}, S_9, S_8, S_7, S_6, S_5, S_4, S_3$ and $S_2$. In each iteration, the rightmost syndrome of the sequence is moved to the far left side and the syndrome sequence includes the leftmost nine syndromes.

In response to the change of the parallel-to-serial interface 62, an IBMA algorithm is modified in accordance with the present invention. An IBMA algorithm is exemplified as follows.

Initial condition:

$D^{(-1)} = 0 \quad \delta = 1 \quad \beta^{(-1)}(x) = x^{-1}$
$\Lambda^{(-1)}(x) = 1 \quad T^{(-1)}(x) = 1 \quad \Omega^{(-1)}(x) = 0$
$\Delta^{(0)} = S_1$
For i=0 to 2t-1
{
$\Delta^{(i+1)} = S_{i+2} * \Lambda_0^{(i)} + S_{i+1} * \Lambda_1^{(i)} + ... + S_{i-vi+2} * \Lambda_{vi}^{(i)}$
If $\Delta^{(i)} = 0$ or $2D^{(i-1)} \geq i+1$
$\quad D^{(i)} = D^{(i+1)} \quad \delta = \delta$
$\quad T^{(i)}(x) = x * T^{(i-1)}(x)$
$\quad \beta^{(i)}(x) = x * \beta^{(i-1)}(x)$
$\quad \Lambda^{(i)}(x) = \Lambda^{(i-1)}(x)$
$\quad \Omega^{(i)}(x) = \Omega^{(i-1)}(x)$
Else
$\quad D^{(i)} = i+1-D^{(i-1)} \quad \delta = \Delta^{(i)}$
$\quad T^{(i)}(x) = \Lambda^{(i-1)}(x)$
$\quad \beta^{(i)}(x) = \Omega^{(i-1)}(x)$
$\quad \Lambda^{(i)}(x) = \delta * \Lambda^{(i-1)}(x) + \Delta^{(i)} * x * T^{(i-1)}(x)$
$\quad \Omega^{(i)}(x) = \delta * \Omega^{(i-1)}(x) + \Delta^{(i)} * x * \beta^{(i-1)}(x)$
} where $\Lambda^{(i)}(x)$ is the error location polynomial at the ith iteration $\Lambda_j^{(i)}(x)$ is coefficients of orders of $\Lambda^{(i)}(x)$ J is x order $\Delta^{(i)}$ is the discrepancy at ith iteration $\delta$ is the discrepancy of $T^{(i)}(x)$ with corrected iteration $T^{(i)}(x)$ is an auxiliary polynomial of $\Lambda(x)$ at the ith iteration.

$D^{(i)}$ is the highest order of the auxiliary polynomial $S(x)$ is a syndrome array $S_1 \sim S_{2t}$ $\Omega(x)$ is a key equation $\beta^{(i)}(x)$ is an auxiliary polynomial of $\Omega(x)$ at the ith iteration In order to have higher regularity and less complexity in hardware implementations, the serial input data sequence in the separated IBMA architecture is listed in Table 3, and the separated error location polynomial and key equation are shown in Table 4.

TABLE 4

| Error location polynomial | Key equation |
|---|---|
| $\Lambda^{(i)}(x) = \Lambda_0^{(i)} + \Lambda_1^{(i)}x + \ldots + \Lambda_{vi}^{(i)}x^{vi}$ | $\Omega(x) = S(x)\Lambda(x) \bmod x^{2t}$ |
| | $\cong \Omega^{(0)} + \Omega^{(1)}x + \ldots \Omega^{(v-1)}x^{v-1}$ |
| $\Lambda_j^{(i)} = \begin{cases} \delta * \Lambda_0^{(i-1)}, & j = 0 \\ \delta * \Lambda_j^{(i-1)} + \Delta^{(i)}T_{j-1}^{(i-1)}, & 1 \leq j \leq vi \end{cases}$ | $\Omega_j^{(i)} = \begin{cases} \delta * \Omega_0^{(i-1)} & \text{for } j = 0 \\ \delta * \Omega_j^{(i-1)} + \Delta^{(i)}\beta_{j-1}^{(i-1)} & \text{for } 1 \leq j \leq vi \end{cases}$ |

TABLE 4-continued

| Error location polynomial | Key equation |
|---|---|
| $\Delta^{(i+1)} = \sum_{j=0}^{vi} \Delta_j^{(i+1)}$ | $\Delta_j^{(i+1)} = \begin{cases} 0, & j = 0 \\ \Delta_{j-1}^{(i+1)} + S_{i-j+3} * \Lambda_{j-1}^{(i)}, & 1 \leq j \leq vi \end{cases}$ |

Figure 8:
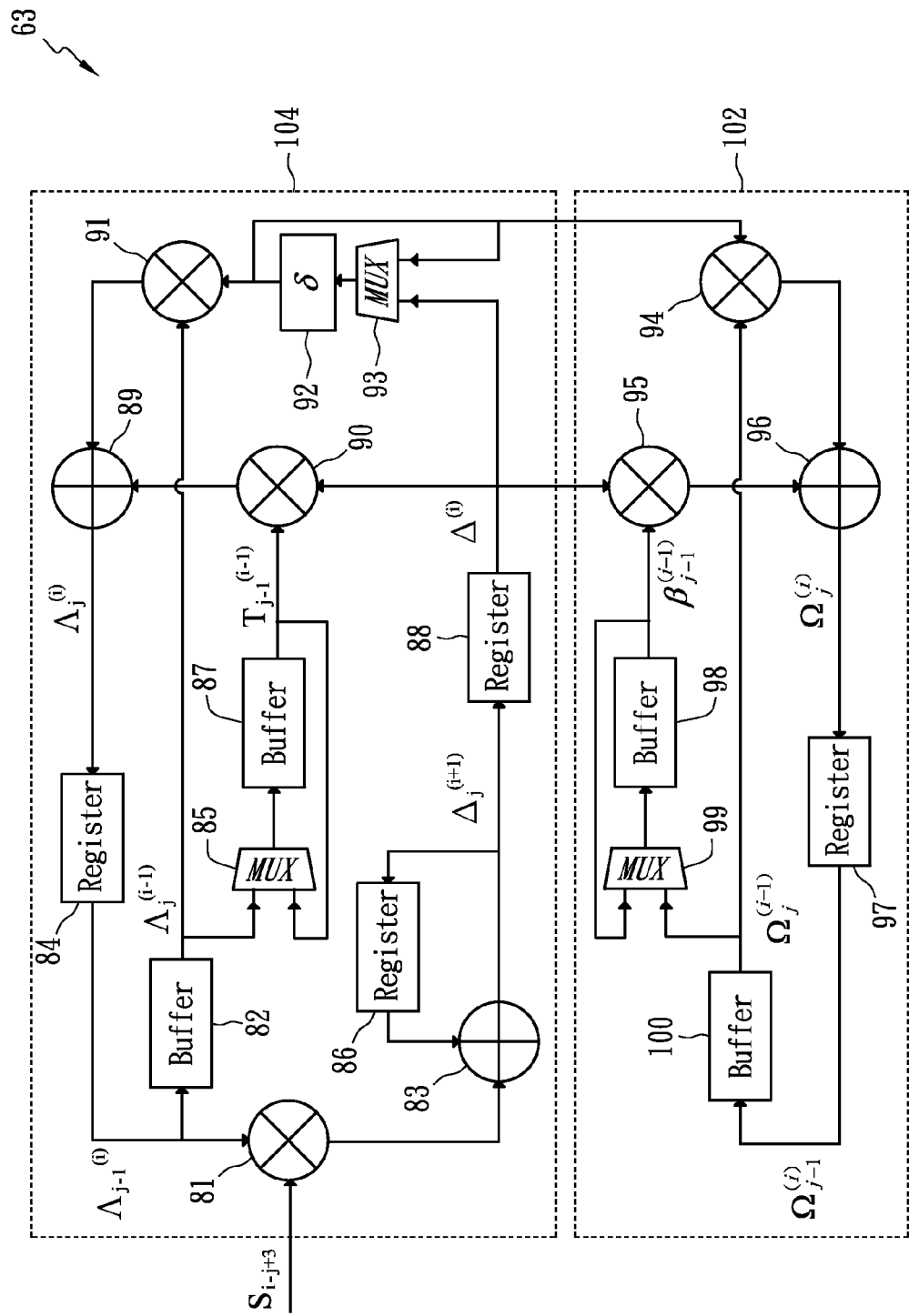
FIG. 8 illustrates a schematic diagram of IBMA architecture of the Reed Solomon decoder in accordance with the present invention.

An IBMA apparatus 63 shown in FIG. 8 includes multipliers 81, 90, 91, 94 and 95, adders 83, 89 and 96, registers 84, 86, 88, 92 and 97, buffers 82, 97, 98 and 100, multiplexers (MUX) 85, 93 and 99. The upper devices 81-93 of the IBMA apparatus 63 constitute an error location polynomial solver 104, which is similar to a traditional IBMA architecture. Devices 94-100 constitute an error value polynomial solver 102. The discrepancy $\Delta^{(i)}$ at the ith iteration is multiplied by the auxiliary polynomial $\beta_{j-1}^{(i-1)}$ at (i−1)th iteration through the multiplexer 95, and discrepancy δ of $T^{(i)}(x)$ having iteration with correction is multiplied by key equation $\Omega_j^{(i-1)}$, then the two results are added to be $\Omega_j^{(i)}$, so as to further acquire the key equation $\Omega(x)$. Accordingly, error location polynomial and error value polynomial, i.e., key equation, $\Omega(x)$, are obtained simultaneously based on $\Delta^{(i)}$ and δ.

The error location polynomial $\Lambda(x)$ and discrepancy $\Delta$ are calculated according to the following equations (1) and (2), respectively. Superscript (i) indicates the ith iteration of IBMA computation, and the discrepancy $\Delta$ is a value to determine whether error location polynomial $\Lambda(x)$ in the next iteration needs to be corrected. When i is equal to 2t, the polynomial of the Reed Solomon decoder is in response to largest error symbol. Superscript v is the number of error symbol of the decoding correction $v \leq t$.

$$\Lambda^{(i)}(x) = \Lambda_0^{(i)} + \Lambda_1^{(i)}x + \ldots + \Lambda_{vi}^{(i)}x^{vi} \quad (1)$$

$$\Delta^{(i)} = \Lambda_0^{(i)}S_{i+1} + \Lambda_1^{(i)}S_i + \ldots + \Lambda_v^{(i)}S_{i+1-v} \quad (2)$$

Table 3 shows syndromes in each iteration. For example, discrepancy $\Delta$ at the 0th iteration is equal to $\Lambda_0^{(0)}S_{0+1} + \Lambda_1^{(0)}S_0 + \ldots + \Lambda_v^{(0)}S_{0+1-v}$. Initial $\Lambda^{(0)}(x)=1$, therefore only the coefficient at zero order is not equal to zero, i.e., only $S_1$ is a meaningful syndrome. Because the coefficients of other orders are zero, the multiplication of zero and an arbitrary number are zero. Therefore, the calculation of $\Delta^{(0)}$ is not affected even if other syndromes are arbitrary numbers. Moreover, only a coefficient of an order of $\Lambda(x)$ is increased in each iteration, and the largest order is less than one. Therefore, the problem of coefficients of orders of polynomials having no corresponding syndrome values will not occur in the computation of discrepancy $\Delta$.

Consequently, based on the feature that no influence on computation of discrepancy $\Delta$ occurs when the coefficients of the orders of $\Lambda(x)$ are equal to zero, the lengths of syndrome sequences for calculating $\Delta$ are fixed to be t+1 including pseudo codes not affecting discrepancy $\Delta$, as shown in Table 3.

An IBMA computation is exemplified as follows.

| i | $\Lambda^{(i)}(x)$ | $\Delta^{(i)}$ | $\Omega^{(i)}(x)$ | v |
|---|---|---|---|---|
| −1 | 1 | 1 | $X^{-1}$ | −1 |
| 0 | 1 | $S_1$ | 0 | −1 |

Initial parameters are listed in the above table for the IBMA computations, and all elements of GF(8) are listed as follows GF(8) constructed by $p(x)=x^3+x+1$
$0 \leftrightarrow (0, 0, 0)$
$\alpha \leftrightarrow (0, 1, 0)$
$\alpha^2 \leftrightarrow (0, 0, 1)$
$\alpha^3 = \alpha+1 \leftrightarrow (1, 1, 0)$
$\alpha^4 = \alpha^2+\alpha \leftrightarrow (0, 1, 1)$
$\alpha^5 = \alpha^2+\alpha+1 \leftrightarrow (1, 1, 1)$
$\alpha^6 = \alpha^2+1 \leftrightarrow (1, 0, 1)$
$\alpha^7 = 1 \leftrightarrow (1, 0, 0)$ In the first iteration, $\Delta^{(0)}$ is not equal to zero; therefore $\Lambda^{(1)}(X)$ and $\Omega^{(1)}(X)$ are corrected.

For the $\Delta^{(0)}$ calculation, it is equal to the multiplication of $S_1$ and $\Lambda^{(0)}(X)$. In this example, the number of corrections is two, so that the highest orders of the error location polynomial and error value polynomial are $X^2$. Therefore, the syndrome array can be of fixed lengths to match the highest order of the polynomial. Three syndromes are operated with $X^0$, $X^1$, $X^2$, i.e., $\Delta^{(0)}=[S_1 \ S_4 \ S_3]*\Lambda^{(0)}(X)=[S_1 \ S_4 \ S_3]*[1 \ 0 \ 0]=S_1*1+S_4*0+S_3*0=\alpha^6$.

v=−1 & i=0

$\Delta^{(0)}=S_1=\alpha^6 \neq 0$ $\Lambda^{(1)}(X)=\Delta^{(-1)}*\Lambda^{(0)}(X)+\Delta^{(0)}*X^{(0-(-1))}*\Lambda^{(-1)}(X)$ $\Lambda^{(1)}(X)=1*1+S_1X^{(1)}*1=1+S_1X=1+\alpha^6X$ $\Omega^{(1)}(X)=\Delta^{(-1)}*\Omega^{(0)}(X)+\Delta^{(0)}*X^{(0-(-1))}*\Omega^{(-1)}(X)$ $\Omega^{(1)}(X)=1*0+S_1X^{(1)}*X^{-1}=S_1=\alpha^6$ In the second iteration, $\Delta^{(1)}$ is not equal to zero, therefore $\Lambda^{(2)}(X)$ and $\Omega^{(2)}(X)$ are corrected.

For the $\Delta^{(1)}$ calculation, it is equal to the multiplication of $S_1, S_2$ and $\Lambda^{(1)}(X)$. In this example, the number of corrections is two, so that the highest orders of the error location polynomial and error value polynomial are $X^2$. Therefore, the syndrome array can be of fixed lengths to match the highest order of the polynomial. Three syndromes are operated with $X^0$, $X^1$, $X^2$, i.e., $\Delta^{(1)}=[S_2 \ S_1 \ S_4]*\Lambda^{(1)}(X)=[S_2 \ S_1 \ S_4]*[1 \ \alpha^6 \ 0]=S_2*1+S_1*\alpha^6+S_4*0=\alpha^2$.

v=0 & i=1

$\Delta^{(1)}=\Lambda_0^{(1)}S_2+\Lambda_1^{(1)}S_1=\alpha^3+\alpha^5=\alpha^2 \neq 0$ $\Lambda^{(2)}(X)=\Delta^{(0)}*\Lambda^{(1)}(X)+\Delta^{(1)}*X^{(1-0)}*\Lambda^{(0)}(X)$ $\Lambda^{(2)}(X)=\alpha^6(1+\alpha^6X)+\alpha^2*X^{(1)}*1$ $\Lambda^{(2)}(X)=\alpha^6+\alpha^{12}X+\alpha^2X=\alpha^6+\alpha^3X$ $\Omega^{(2)}(X)=\Delta^{(0)}*\Omega^{(1)}(X)+\Delta^{(1)}*X^{(1-0)}*\Omega^{(0)}(X)$ $\Omega^{(2)}(X)=\alpha^6\alpha^6+\alpha^2*X^{(1)}*0=\alpha^5$ In the third iteration, $\Delta^{(2)}$ is not equal to zero; therefore $\Lambda^{(3)}(X)$ and $\Omega^{(3)}(X)$ are corrected.

For the $\Delta^{(2)}$ calculation, it is equal to the multiplication of $S_2, S_3$ and $\Lambda^{(2)}(X)$. In this example, the number of corrections is two, so that the highest orders of the error location polynomial and error value polynomial are $X^2$. Therefore, the syndrome array can be of fixed lengths to match the highest order of the polynomial. Three syndromes are operated with $X^0$, $X^1$, $X^2$, i.e., $\Delta^{(2)}=[S_3\ S_2\ S_1]*\Lambda^{(2)}(X)=[S_3\ S_2\ S_1]*[\alpha^6\ \alpha^3\ 0]=S_3\alpha^6+S_2*\alpha^3+S_1*0=\alpha^4$.

v=1 & i=2

$\Delta^{(2)}=\Lambda_0^{(2)}S_3+\Lambda_1^{(2)}S_2=\alpha^6*\alpha^4+\alpha^3*\alpha^3$ $\Delta^{(2)}=\alpha^3+\alpha^6=\alpha^4\neq 0$ $\Lambda^{(3)}(X)=\Delta^{(1)}*\Lambda^{(2)}(X)+\Delta^{(2)}*X^{(2-1)}*\Lambda^{(1)}(X)$ $\Lambda^{(3)}(X)=\alpha^2(\alpha^6+\alpha^3 X)+\alpha^4*X^{(1)}*(1+\alpha^6 X)$ $\Lambda^{(3)}(X)=\alpha+\alpha^5 X+\alpha^4 X+\alpha^3 X^2=\alpha+X+\alpha^3 X^2$ $\Omega^{(3)}(X)=\Delta^{(1)}*\Omega^{(2)}(X)+\Delta^{(2)}*X^{(2-1)}*\Omega^{(1)}(X)$ $\Omega^{(3)}(X)=\alpha^2*\alpha^5+\alpha^4*X^{(1)}*\alpha^6=\alpha^7+\alpha^3 X$ In the fourth iteration, $\Delta^{(3)}$ is not equal to zero; therefore $\Lambda^{(4)}(X)$ and $\Omega^{(4)}(X)$ are corrected.

For the $\Delta^{(3)}$ calculation, it is equal to the multiplication of $S_2$, $S_3$, $S_4$ and $\Lambda^{(3)}(X)$. In this example, the number of corrections is two, so that the highest orders of the error location polynomial and error value polynomial are $X^2$. Therefore, the syndrome array can be of fixed lengths to match the highest order of the polynomial. Three syndromes are operated with $X^0$, $X^1$, $X^2$ i.e., $\Delta^{(3)}=[S_4\ S_3\ S_2]*\Lambda^{(3)}(X)=[S_4\ S_3\ S_2]*[\alpha\ 1\ \alpha^3]=S_4*\alpha+S_3*1+S_2*\alpha^3=\alpha^6$.

v=2 & i=3

$\Delta^{(3)}=\Lambda_0^{(3)}S_4+\Lambda_1^{(3)}S_3+\Lambda_2^{(3)}S_2$ $\Delta^{(3)}=\alpha*\alpha^3+1*\alpha^4+\alpha^3*\alpha^3$ $\Delta^{(3)}=\alpha^4+\alpha^4+\alpha^6=\alpha^6\neq 0$ $\Lambda^{(4)}(X)=\Delta^{(2)}*\Lambda^{(3)}(X)+\Delta^{(3)}*X^{(3-2)}*\Lambda^{(2)}(X)$ $\Lambda^{(4)}(X)=\alpha^4(\alpha+X+\alpha^3 X^2)+\alpha^6*X*(\alpha^6+\alpha^3 X)$ $\Lambda^{(4)}(X)=\alpha^5+\alpha^4 X+X^2+\alpha^5 X+\alpha^2 X^2$ $\Lambda^{(4)}(X)=\alpha^5+X+\alpha^6 X^2$ $\Omega^{(4)}(X)=\Delta^{(2)}*\Omega^{(3)}(X)+\Delta^{(3)}*X^{(3-2)}*\Omega^{(2)}(X)$ $\Omega^{(4)}(X)=\alpha^4*(\alpha^7+\alpha^3 X)+\alpha^6*X*\alpha^5=\alpha^4+\alpha^5 X$ $\Lambda^{(4)}(X)$ and $\Omega^{(4)}(X)$ are the error location polynomial and error value polynomial, respectively, in this example.

Figure 9:
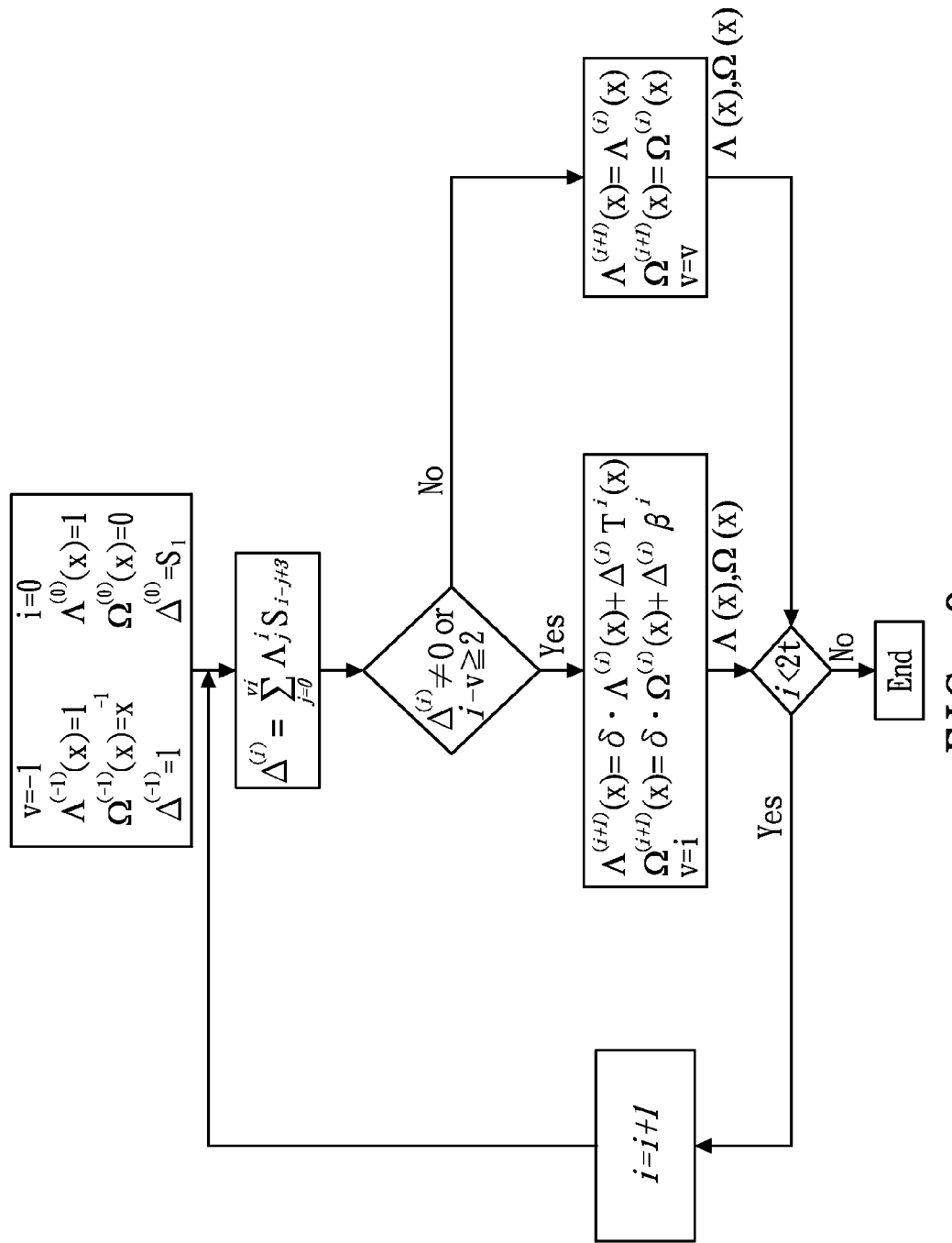
FIG. 9 is an IBMA algorithm flow chart of the Reed Solomon decoder in accordance with the present invention.

FIG. 9 illustrates a flow chart for the IBMA algorithm. First, initial conditions are determined, and $\Delta^{(i)}$ is calculated based on the initial conditions. If $\Delta^{(i)}\neq 0$ or $i-v\geq 2$, the error location polynomial and the error value polynomial need to be corrected. The process is repeated by iterating $i=i+1$ if $i<2t$.

The above-described embodiments of the present invention are intended to be illustrative only. Numerous alternative embodiments may be devised by those skilled in the art without departing from the scope of the following claims.

What is claimed is:

1. A parallel-to-serial conversion method of Inversionless Berlekamp-Massey Algorithm (IBMA) of a Reed Solomon decoder for obtaining discrepancies of IBMA iterations to derive an error location polynomial and an error value polynomial, the method used in a Reed Solomon decoder and comprising:

setting syndrome sequences to be of same lengths when calculating the discrepancy in each IBMA iteration, wherein the number of syndromes of the syndrome sequences is t+1, and t is the largest number of symbols that are corrected of the error location polynomial, wherein the syndrome sequences set to be of same lengths are based on the feature that the discrepancies are not affected if coefficients of orders of the error location polynomial are zero.

2. The parallel-to-serial conversion method in accordance with claim 1, wherein the syndrome sequence comprises syndromes of the orders of the error location polynomial not equal to zero and syndromes of orders of the error location polynomial equal to zero in reverse order.

3. The parallel-to-serial conversion method in accordance with claim 1, wherein in each iteration the syndromes of the syndrome sequence in a previous iteration are shifted right, the rightmost syndrome is removed, and a syndrome next to the leftmost syndrome in the previous iteration is added to the left of the syndrome sequence.

4. The parallel-to-serial conversion method in accordance with claim 1, wherein the syndrome sequence is selected from a sequence including syndromes, in each iteration the rightmost syndrome is moved to the far left side and the syndrome sequence includes the leftmost t+1 syndromes.

5. An IBMA method of Reed Solomon decoder, the method used in a Reed Solomon decoder and comprising:
obtaining discrepancies of IBMA iterations based on syndrome sequences; and
simultaneously obtaining an error location polynomial and an error value polynomial based on the discrepancies, wherein the syndrome sequences set to be of same lengths are based on the feature that the discrepancies are not affected if coefficients of orders of the error location polynomial are zero.

6. The IBMA method of Reed Solomon decoder in accordance with claim 5, wherein the syndrome sequence comprises syndromes of orders of the error location polynomial not equal to zero and syndromes of orders of the error location polynomial equal to zero in reverse order.

7. The IBMA method of Reed Solomon decoder in accordance with claim 5, wherein in each iteration the syndromes of the syndrome sequence in a previous iteration are shifted right, the rightmost syndrome is removed, and a syndrome next to the leftmost syndrome in the previous iteration is added to the left of the syndrome sequence.

8. The IBMA method of Reed Solomon decoder in accordance with claim 5, wherein the error value polynomial is obtained by using initial conditions and discrepancies in obtaining the error location polynomial to separate different information for the error location polynomial and the error value polynomial, thereby the error location polynomial and the error value polynomial are calculated in parallel.

9. The IBMA method of Reed Solomon decoder in accordance with claim 5, wherein the syndrome sequences are of same lengths.

10. A Reed Solomon decoder, comprising:
a parallel-to-serial interface; and
an IBMA apparatus connected to an output end of the parallel-to-serial interface and comprising:
an error location polynomial solver configured to calculate an error location polynomial based on discrepancies of IBMA iterations; and
an error value polynomial solver connected to an output end of the discrepancies of the error location polynomial solver and configured to calculate an error value polynomial based on the discrepancies;

wherein the error location polynomial and the error value polynomial are obtained simultaneously, the syndrome sequences of the parallel-to-serial interface set to be of same lengths are based on the feature that the discrepancies are not affected if coefficients of orders of the error location polynomial are zero.

11. The Reed Solomon decoder in accordance with claim 10, wherein the error value polynomial solver comprises:

a first multiplier by which the discrepancy is multiplied by an auxiliary polynomial of the error value polynomial;

a second multiplier by which the discrepancy with corrected iteration is multiplied by a coefficient of the error value polynomial; and an adder by which multiplications obtained from the first and second multipliers are added to be a coefficient of next order of the error value polynomial.

12. The Reed Solomon decoder in accordance with claim 10, wherein the syndrome sequences of the parallel-to-serial interface are set to be of same lengths when calculating the discrepancy in each IBMA iteration, and the number of syndromes of the syndrome sequences is t+1, and t is the largest number of symbols that are corrected of the error location polynomial.

13. The Reed Solomon decoder in accordance with claim 12, wherein the syndrome sequence comprises syndromes of orders of the error location polynomial not equal to zero and syndromes of orders of the error location polynomial equal to zero in reverse order.

14. The Reed Solomon decoder in accordance with claim 12, wherein in each iteration syndromes of the syndrome sequence in a previous iteration are shifted right, the rightmost syndrome is removed, and a syndrome next to the leftmost syndrome in the previous iteration is added to the left of the syndrome sequence.

15. The Reed Solomon decoder in accordance with claim 10, further comprising a syndrome calculator configured to provide syndromes to the parallel-to-serial interface.

16. The Reed Solomon decoder in accordance with claim 10, further comprising a Chien search device configured to solve an error location based on the error location polynomial and the error value polynomial.

* * * * *